United States Patent
Li et al.

(10) Patent No.: US 12,266,579 B2
(45) Date of Patent: Apr. 1, 2025

(54) METHOD AND SYSTEM FOR ADJUSTING THE GAP BETWEEN A WAFER AND A TOP PLATE IN A THIN-FILM DEPOSITION PROCESS

(71) Applicant: Taiwan Semiconductor Manufacturing Co., Ltd., Hsinchu (TW)

(72) Inventors: Sheng-Chan Li, Hsinchu (TW); Sheng-Chau Chen, Hsinchu (TW); Cheng-Hsien Chou, Hsinchu (TW); Cheng-Yuan Tsai, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 659 days.

(21) Appl. No.: 17/461,004

(22) Filed: Aug. 30, 2021

(65) Prior Publication Data
US 2023/0069081 A1     Mar. 2, 2023

(51) Int. Cl.
| | | |
|---|---|---|
| *H01L 21/02* | (2006.01) | |
| *C23C 16/46* | (2006.01) | |
| *C23C 16/50* | (2006.01) | |
| *C23C 16/52* | (2006.01) | |
| *H01J 37/32* | (2006.01) | |
| *H01L 21/66* | (2006.01) | |

(52) U.S. Cl.
CPC ............. *H01L 22/20* (2013.01); *C23C 16/46* (2013.01); *C23C 16/50* (2013.01); *C23C 16/52* (2013.01); *H01J 37/32724* (2013.01); *H01J 37/32944* (2013.01); *H01L 21/02274* (2013.01); *H01J 2237/3321* (2013.01)

(58) Field of Classification Search
CPC ............. G03F 7/70025; G03F 7/70605; G03F 7/70608; G03F 7/706847; G03F 7/706849; G03F 7/706851; G03F 7/70008; G03F 7/70483; G03F 7/70033
See application file for complete search history.

(56) References Cited

U.S. PATENT DOCUMENTS

| | | | | |
|---|---|---|---|---|
| 2009/0050270 A1* | 2/2009 | Bagley | ............... | H01L 21/67265 118/712 |
| 2013/0323860 A1* | 12/2013 | Antolik | .................. | H01J 37/023 156/345.34 |
| 2014/0308763 A1* | 10/2014 | Jeong | ..................... | H10K 71/00 118/712 |
| 2016/0288403 A1* | 10/2016 | Schumaker | ........... | G03F 7/0002 |
| 2018/0290168 A1* | 10/2018 | Han | .................. | C23C 16/45565 |

(Continued)

FOREIGN PATENT DOCUMENTS

| | | | | | |
|---|---|---|---|---|---|
| CN | 101360988 A | * | 2/2009 | ......... | G01N 21/9501 |
| CN | 106841396 A | * | 6/2017 | | |

(Continued)

*Primary Examiner* — Edward Chin
(74) *Attorney, Agent, or Firm* — Seed IP Law Group

(57) ABSTRACT

A thin-film deposition system includes a top plate positioned above a wafer and configured to generate a plasma during a thin-film deposition process. The system includes a gap sensor configured to generate sensor signals indicative of a gap between the wafer and the top plate. The system includes a control system configured to adjust the gap during the thin-film deposition process responsive to the sensor signals.

20 Claims, 6 Drawing Sheets

(56) References Cited

U.S. PATENT DOCUMENTS

| | | | | |
|---|---|---|---|---|
| 2020/0331190 A1* | 10/2020 | Nakamura | ............ | G03F 7/0002 |
| 2021/0373135 A1* | 12/2021 | Syvenkyy | ............. | G01S 7/4813 |
| 2022/0179000 A1* | 6/2022 | Jang | .................... | H02J 7/00034 |
| 2023/0090068 A1* | 3/2023 | Rajput | ................ | H04L 61/5076 |
| | | | | 370/254 |

FOREIGN PATENT DOCUMENTS

| | | | | | |
|---|---|---|---|---|---|
| ES | 2765744 | T3 | * | 6/2020 | ........... G01B 11/026 |
| JP | 2009258391 | A | * | 11/2009 | |
| JP | 2010080630 | A | * | 4/2010 | ............. B82Y 10/00 |
| JP | 5149184 | B2 | * | 2/2013 | ............. B01L 3/0268 |
| JP | 2013026288 | A | * | 2/2013 | ............. B82Y 10/00 |
| JP | 2013506972 | A | * | 2/2013 | |
| JP | 2014110384 | A | * | 6/2014 | |
| KR | 20130014811 | A | * | 2/2013 | |
| KR | 20200063638 | A | * | 6/2020 | |

* cited by examiner

METHOD AND SYSTEM FOR ADJUSTING THE GAP BETWEEN A WAFER AND A TOP PLATE IN A THIN-FILM DEPOSITION PROCESS

BACKGROUND

Technical Field

The present disclosure relates to the field of semiconductor processing. The present disclosure relates more particularly to thin-film deposition processes.

Description of the Related Art

Fabrication of integrated circuits is typically accomplished by performing a large number of processing steps on semiconductor wafers. The processing steps typically result in the formation of a large number of transistors in highly complex arrangements in conjunction with a semiconductor substrate. The processing steps also result in the formation of dielectric layers, metal interconnects, vias, plugs, and other integrated circuit structures and components.

During thin-film deposition processes, it is possible that electrical arcing will occur within the processing environment. The electrical arcing may damage semiconductor wafers. The result is that the damaged semiconductor wafers may need to be discarded.

DETAILED DESCRIPTION

Figure 1:
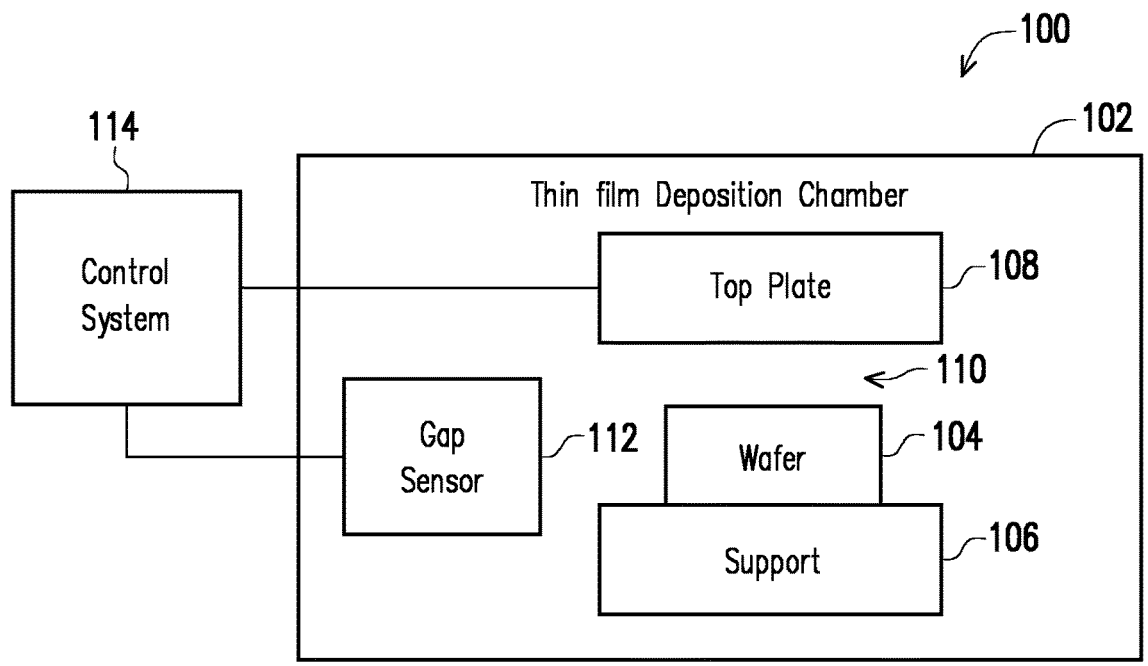
FIG. 1 is a block diagram of a thin-film deposition system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may just distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise. Embodiments of the present disclosure provide a thin-film deposition system with improved performance. A thin-film deposition system includes a top plate positioned above a wafer. Embodiments of the present disclosure monitor the gap between the top plate and the wafer and automatically adjust the gap in-situ during a deposition process. This helps prevent arcing between the top plate and the wafer due to smaller than desired gaps. This also provides for steady deposition rates. The result is that fewer wafers are scrapped, equipment is replaced less frequently, and thin-films are properly formed.

FIG. 1 is a block diagram of a thin-film deposition system 100, according to one embodiment. The thin-film deposition system 100 includes a thin-film deposition chamber 102. During thin-film deposition processes, a wafer 104 is supported within the thin-film deposition chamber 102 by a wafer support 106. The thin-film deposition system 100 deposits a thin-film on the wafer 104 during the thin-film deposition process.

The thin-film deposition system 100 includes a top plate 108 positioned above the wafer 104. The top plate 108 can assist in the thin-film deposition process. For example, the top plate 108 can assist in generating a voltage or electric field within the thin-film deposition chamber 102. The voltage or electric field can facilitate deposition of a selected type of thin-film on the wafer 104.

The wafer 104 is separated from the top plate 108 by a gap 110. The gap 110, i.e., the distance between the top surface of the wafer 104 and the bottom surface of the top plate 108 can have an effect on the thin-film deposition process. If the gap is too large, then a thin-film may not be properly deposited or may have a very low deposition rate. If the gap is too small, the wafer 104 or the top plate 108 could be damaged during a thin-film deposition process.

The thin-film deposition system 100 includes a gap sensor 112. The gap sensor 110 is configured to generate sensor signals based on the gap 110. The sensor signals are indicative of the size of the gap 110. The sensor signals can indicate the magnitude of the gap 110 or the relative size of the gap 110. In any case, the sensor signals can be utilized to determine whether or not the gap 110 should be adjusted.

In one embodiment, the gap sensor 112 can include a radiation emitter that emits electromagnetic radiation into the gap 110. The gap sensor 112 can also include a radiation sensor that senses the radiation emitted through the gap. The amount of radiation sensed by the radiation sensor of the gap sensor 112 can be indicative of the size of the gap. The radiation sensor can provide sensor signals indicative of the size of the gap. The radiation emitter can emit electromagnetic radiation in the visible spectrum, the infrared spectrum, the ultraviolet spectrum, or another spectrum. The radiation emitter can emit radiation in a laser beam or in another manner.

In one embodiment, the gap sensor 112 includes an image capture device that captures an image of the gap 110. The image capture device can capture visible light images, infrared images, ultraviolet light images, or other types of images. The size of the gap 110 can be measured from the captured image. Various other types of gap sensors 112 can be utilized without departing from the scope of the present disclosure.

In FIG. 1, the gap sensor 112 is illustrated as being positioned within the thin-film deposition chamber 102. However, the gap sensor 112 may be positioned external to the thin-film deposition chamber 102 in some embodiments. For example, the gap sensor 112 may sense parameters associated with the gap 110 through one or more apertures or windows in a wall of the thin-film deposition chamber 102. Various positions of the gap sensor 112 can be utilized without departing from the scope of the present disclosure.

The thin-film deposition system 100 includes a control system 114. The control system 114 is coupled to the gap sensor 112 and to the top plate 108. The control system 114 receives the sensor signals from the gap sensor 112. The control system 114 can determine whether or not the gap 110 should be adjusted based on the sensor signals from the gap sensor 112. The control system 114 can adjust the gap 110 by raising or lowering the top plate 108 relative to the wafer 104. Alternatively, the control system 114 can adjust the gap 110 by raising or lowering the support 106 relative to the top plate 108.

In one embodiment, the control system 114 receives analog sensor signals from the gap sensor 112. The control system 114 can convert the analog sensor signals to digital form by performing an analog-to-digital conversion. The control system 114 can then analyze the digitized sensor signals to determine the absolute or relative magnitude of the gap 110. In one example, the control system 114 can compare the digitized sensor signals to reference sensor signals stored in one or more memories associated with the control system 114. The control system 114 can then adjust the gap 110, for example by controlling a motor that raises or lowers the top plate 108.

In one embodiment, the control system 114 receives digital sensor signals from the gap sensor 112. The control system 114 can process and analyze the digital sensor signals received from the gap sensor 112. The control system 114 can then determine whether or not the gap 110 should be adjusted based on analysis of the sensor signals.

Figure 2:
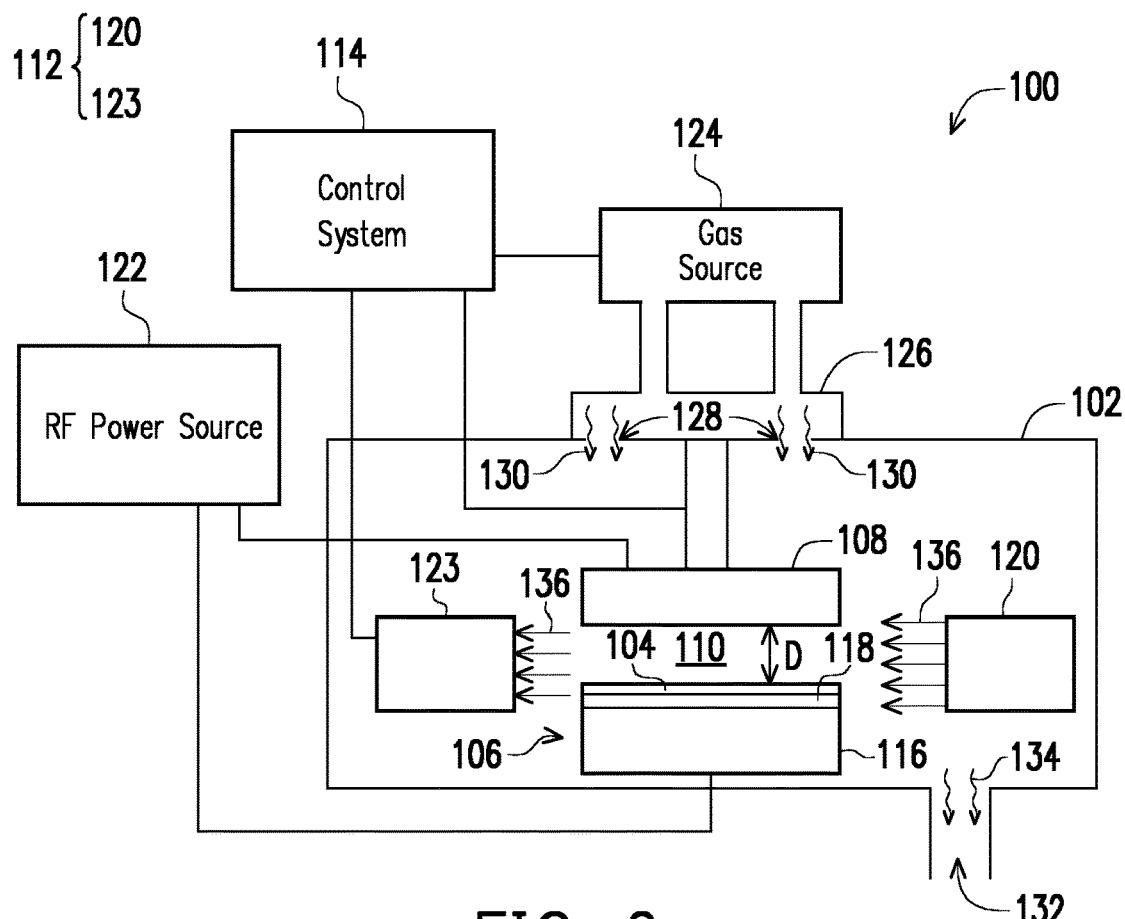
FIG. 2 is an illustration of a thin-film deposition system, according to one embodiment.

FIG. 2 is an illustration of a thin-film deposition system 100, according to one embodiment. The thin-film deposition system 100 includes a thin-film deposition chamber 102. The thin-film deposition chamber 102 includes a wafer 104 supported on a wafer support 106. The thin-film deposition system 100 deposits a thin-film on the surface of the wafer 104 during a thin-film deposition process.

In the example FIG. 2, the thin-film deposition system 100 is a plasma enhanced chemical vapor deposition (PECVD) system. The plasma enhanced chemical vapor deposition system can be utilized to deposit dielectric layers on the wafer 104. The dielectric layers can include silicon oxides, silicon nitride, or other types of dielectric layers. The thin-film deposition system 100 can be utilized to deposit other types of layers or to perform other types of semiconductor processes than those described above without departing from the scope of the present disclosure.

The support 106 supports a wafer 104. The support 106 can include a heater 116 or can function as a heater to heat the wafer 104 during the thin-film deposition process. Heating the wafer 104 can facilitate deposition of a thin-film on the surface of the wafer 104. The heater 116 can include one or more heating coils that generate heat and heat the wafer 104. Alternatively, the heater 116 can include other types of heating elements for generating heat and heating the wafer 104. Further details regarding the heating function of the support 106 will be described in further detail below.

The support 106 can also include a bottom plate 118. The bottom plate 118 can be a bottom electrode to facilitate the generation of plasma within the thin-film deposition chamber 102 as will be described in more detail below. In one embodiment, the wafer 104 rest directly on the bottom plate 118. The bottom plate 118 can include a conductive material such as a metal or conductive ceramic. In one embodiment, the heater 116 and the bottom plate 118 can be integrated together.

The thin-film deposition system 100 includes a top plate 108 and a radio frequency power source 122. The top plate 108 acts as a top electrode for generating a plasma during a thin-film deposition process. The top plate 108 can include a conductive material such as a metal or conductive ceramic material.

During a thin-film deposition process, the radiofrequency power source 122 provides a radiofrequency voltage between the bottom plate 118 and the top plate 108. The electrical connections between the radiofrequency power source 122 and the bottom and top plates 118 and 108 are not show$_n$ in FIG. 2. The radiofrequency power source 122 is also coupled to the control system 114. The control system 114 can control the function of the radiofrequency power source 122. During a thin-film deposition process, the control system 114 can cause the radiofrequency power source 122 to apply the radiofrequency voltage between the top plate 108 and the bottom plate 118.

The thin-film deposition system 100 includes a gas source 124 and the manifold 126. During the thin-film deposition process the gas source 124 supplies deposition gasses 130 into the thin-film deposition chamber via the manifold 126. The thin-film deposition chamber 102 can include apertures 128 that enable the flow of deposition gasses 130 into the thin-film deposition chamber 102 from the gas source 124. The flow of the thin-film deposition gasses 130 into the thin-film deposition chamber 102, in combination with other factors, results in the deposition of a thin-film on the top surface of the wafer 104. The system 100 includes an exhaust channel 132 by which exhaust fluids 134 are evacuated from the thin-film deposition chamber 102.

In one embodiment, the thin-film deposition system 100 includes a top lid. The top lid can include the apertures 130 through which deposition gases flow into the deposition chamber 102 during thin-film deposition processes. In the example of FIG. 2, the top plate 108 is shown as being separate from the components that flow deposition gases into the thin-film deposition chamber 102. However, in one embodiment, the top plate 108 can be a showerhead type top electrode that includes a plurality of apertures in fluid communication with the gas source 124. In this case, deposition gasses 130 are output from the gas source 124 through the apertures in the top plate 108 into the thin-film deposition chamber 102. Other types of systems and components can be utilized for flowing deposition gases into the thin-film deposition chamber 102 without departing from the scope of the present disclosure.

In the example of FIG. 2, the top plate 108 is a showerhead type electrode including a plurality of vent holes 134 that enable gas to flow from the gas source 124 into the interior volume 103. The top electrode 127 and the bottom electrode 128 are coupled to a radio frequency power source. The radio frequency power source can be coupled to or can be part of the control system 114. During a PECVD process, deposition gasses 130 are passed from the gas source 124 into the interior volume of the thin-film deposition chamber 102. The radiofrequency power source 122 generates a plasma from the deposition gasses within the interior volume by applying a voltage between the bottom plate 118 and the top plate 108. In particular, the plasma is generated between the top surface of the wafer 104 and the bottom surface of the top plate 108. The plasma enhances deposition of a thin-film on the wafer 104.

In one example, the radiofrequency power source 122 applies and AC voltage signal having a frequency between 5 MHz and 15 MHz. In one example, the radiofrequency power source 122 applies the radiofrequency voltage of the magnitude between 100 V and 500 V. Other frequencies and voltages can be utilized without departing from the scope of the present disclosure. Furthermore in some examples, the plasma may be generated by application of a DC voltage. In some examples, the bottom plate 118 is not present in the plasma is generated primarily by applying a voltage to the top plate 108.

PECVD processes follow particular recipes based on the particulars of the PECVD system, the thin-film to be deposited, and other factors. One factor in the PECVD recipe is the distance D between the top surface of the wafer 104 and the bottom surface of the top plate 108. The distance D corresponds to the magnitude of the gap 110. Accordingly, the gap 110 corresponds to the distance between the top surface of the wafer 104 and the bottom surface of the top plate 108. If the magnitude of the gap 110 is outside of a selected range, then the thin-film deposition process may not be performed properly. As will be set forth in more detail below, damage to the wafer 104, damage to the top plate 108, insufficient thickness of the thin-film, and improper composition of the thin-film are all possible results of the gap 110 being outside a selected range in accordance with the recipe of the particular PECVD process. Accordingly, the thin-film deposition process is sensitive to the magnitude of the gap 110.

For some PECVD processes or systems, the desired gap 110 may be somewhere between 5 mm and 20 mm. In other cases, the desired May be significantly smaller. For example, in one embodiment, the PECVD thin-film deposition system 100 calls for a gap 110 somewhere between 0.2 mm and 0.7 mm based on the particular process and other factors. The actual tolerance range may be less than 0.1 mm. For example, the PECVD system may call for a gap 110 of 0.5 mm, with a tolerance range of +0.1 mm outside of this value. In other words, the recipe may call for gap 110 between 0.4 and 0.6 mm.

While performing PECVD process on the wafer 104, it is possible that electrical arcing may occur if the gap 110 is too small. Arcing is the momentary flow of high electrical current between the wafer 104 and the top plate 108. The arcing can occur due to the buildup of electrostatic charge between the wafer 104 and the top plate 108. If electrostatic charge builds up in the gap 110 is not sufficiently large, and arcing may occur.

If arcing occurs in the vicinity of the wafer 104, it is possible that the wafer 104 will be damaged. For example, if arcing results in the flow of large currents between a portion of the wafer 104 and the top plate 108, then the currents can damage the wafer 104. If the wafer 104 is damaged, it is possible that some integrated circuit dies that result from the wafer 104 will not function properly. In some cases, the wafer 104 may be sufficiently damaged that the entire wafer 104 will need to be discarded. This results in a significant loss of time, materials, and money.

Additionally, and potentially even more costly, the top plate 108 can be damaged by arcing. If the top plate 108 is damaged by arcing, the top plate 108 may need to undergo an expensive and time-consuming cleaning or repair process. Possibly, the top plate 108 may need to be replaced. This can be extremely expensive. In any case, the thin-film deposition processes may need to be halted until the top plate one can be repaired or replaced. The loss of production time compounds the expense of replacing or repairing the top plate 108.

Aside from damage to the wafer 104 or the top plate 108, the thin-film deposition process can be adversely affected by the gap 110 being outside of the desired range. The deposition rate, i.e. how quickly the thin-film builds up during the thin-film deposition process, can be affected by the magnitude of the gap 110. If the gap 110 is too wide, then the deposition rate may slow. If deposition rates slow down, then the thin-films may not be properly deposited. For example, if a layer of silicon dioxide is intended to have a final thickness of 20 nm, then the duration of the thin-film deposition process may need to be carefully timed based on the expected deposition rate. If the deposition rate is slower than expected, then the thin-film may not be as thick as expected. This can cause poor function, or complete malfunction, of integrated circuits that result from the wafer 104. Furthermore, it is possible that the thin-film will not have the intended composition if the gap 110 is not within the selected range.

There are various factors that can cause undesired fluctuations in the gap 110 during the thin-film deposition processes. For example, as described previously, the heater 116 heats the wafer 104 during the thin-film deposition process. Heating of the wafer 104 they also result in some heating of the top plate 108 due to heat transfer between the wafer 104 and the top plate 108. The top plate 108 will undergo thermal expansion as the top plate 108 is heated. The higher the temperature, the greater the thermal expansion. When the gap 110 is already intended to be somewhat small, even a small expansion of the top plate 108 can cause the gap 110 to narrow beyond the intended range. In one example, the heater 116 heats the wafer 104 to about 450° C. Depending on deposition conditions, the temperature of the top plate 108 may correspondingly increase to an unknow$_n$ degree, causing an unknow$_n$ amount of thermal expansion.

Another factor that can result in different gap sizes is differing thicknesses of the wafer 104. For example, some wafers have a thickness of about 770 μm. Other wafers have a thickness of about 720 μm. When the size of the gap one is already small, this 50 μm difference in wafer thicknesses can result in very different thin-film deposition rates. Accordingly, if the thickness of the wafer 104 is either unknow$_n$, unaccounted for, or erroneously accounted for, then the gap one can have a magnitude that is outside the desired range.

The thin-film deposition system 100 includes a gap sensor 112 in the form of a through beam sensor. The through beam sensor includes a radiation emitter 120 and a radiation sensor 123. The radiation emitter 120 emits radiation 136 through the gap one between the wafer 104 and the top plate 108. The radiation sensor 123 is positioned on an opposite side of the wafer 104 and top plate 108 from the radiation emitter 120. The radiation sensor 123 is aligned to receive the radiation 136 after the radiation 136 has passed through the gap 110. The amount of radiation 136 received by the radiation sensor 123 is indicative of the size of the gap 110.

In one example, the radiation emitter 122 emits a beam of radiation 136. The diameter of the beam is greater than the intended magnitude of the gap 110. Accordingly, a portion of the beam of radiation 136 is blocked by the side of the top plate 108 and the sides of the wafer 118, the bottom plate 118, and the heater 116. If the gap 110 is wider, less of the beam will be blocked and a correspondingly greater portion of the beam of radiation 136 will be received by the radiation sensor 123. If the gap 110 is narrower, more of the beam will be blocked in the correspondingly smaller portion of the beam of radiation 136 will be received by the radiation sensor 123. Accordingly, the amount of radiation 136 received by the radiation sensor 123 is indicative of the size of the gap 110.

In one embodiment, the radiation sensor 123 generates a voltage based on the amount of radiation 136 received by the radiation sensor 123. In one example, the radiation sensor 123 generates a voltage between 3.4 V and 3.8 V depending on the size of the gap 110. The higher the voltage, the greater the gap 110.

The radiation sensor 123 outputs sensor signals to the control system 114. The sensor signals can be analog signals or digital signals. The sensor signals can include the voltage generated by the radiation sensor 123 from the received radiation 136. The sensor signals can include analog or digital representations of the voltage generated by the radiation sensor 123 from the received radiation 136. The sensor signals can indicate the absolute magnitude of the gap 110 or relative magnitude of the gap 110.

In one embodiment, the radiation emitter 120 emits an infrared laser beam. The laser beam can have a diameter of between 0.75 cm and 1.5 cm. The diameter of the laser beam can be selected so that under normal operating conditions the gap 110 does not exceed the diameter of the laser beam. The radiation emitter 120 can emit a laser beam in the ultraviolet or visible spectrum.

A specific example of a gap sensor 112 has provided in relation to FIG. 2. However, many other kinds of gap sensors 112 can be implemented without departing from the scope of the present disclosure. For example, a gap sensor 112 can include an array of image capture devices that capture images of the gap 110 and output images or other signals indicative of the size of the gap 110. Many other kinds of gap sensors can be utilized without departing from the scope of the present disclosure.

The control system 114 receives the sensor signals from the radiation sensor 123. The control system 114 analyzes the sensor signals and determines whether or not the gap 110 should be adjusted. If the control system 114 determines that the gap 110 should be adjusted based on the sensor signals, and the control system 114 can control a motor coupled to the top plate 108, or coupled to a mechanism that suspends the top plate 108. The control system 114 can cause the motor to raise or lower the top plate 108 relative to the wafer 104 in order to adjust the gap 110. Raising the top plate 108 relative to the wafer 104 increases the gap 110. Lowering the top plate 108 relative to the wafer 104 reduces the gap 110.

In one embodiment, the control system 114 stores reference data. The reference data can include sensor signals that are know$_n$ to correspond to particular gaps. When the control system 114 receives sensor signals from the radiation sensor 123, or other type of gap sensor 112, the control system 114 compares the sensor signals to the reference data. If the reference data indicates that the sensor signals correspond to a gap 110 that is too large, the control system 114 causes the motor to lower the top plate 108 and decreased the gap 110. If the reference data indicates that the sensor signals correspond to a gap 110 that is too small, the control system 114 causes the motor to raise the top plate 108 and increase the gap 110.

In one example, the deposition recipe calls for gap 110 of about 0.35 mm. The reference data stored by the control system 114 indicates that a gap of 0.35 mm corresponds to sensor signals having a voltage or indicating a voltage of about 3.6 V. If the gap is too small, the the sensor signals may have a voltage or indicated voltage of about 3.5 V. The control system 114 adjusts the gap by raising the top plate 108 during the thin-film deposition process until the sensor signals have a voltage or indicate a voltage of about 3.6 V. If the gap is too large, then the sensor signals may have a voltage or indicate a voltage of about 3.7V. The control system 114 lowers the top plate 108 until the sensor signals have a voltage or indicated voltage of about 3.6 V. The voltages and distances given above are given only by way of example. Other distances, voltages, and types of sensor signals can be utilized without departing from the scope of the present disclosure.

The thin-film deposition system 100 can adjust the gap 110 in situ during a thin-film deposition process. For example, during the thin-film deposition process, the gap sensor 112 may continuously generate sensor signals indicative of the gap 110. The sensor signals may initially indicate that the 110 has the desired value. However, as the deposition process continues the top plate 108 may be completed and they expand due to thermal expansion, thereby decreasing the gap 110. The sensor signals indicate this change in the gap 110 during the thin-film deposition process. The control system 114 can adjust the gap 110 by moving the top plate 108. Thus, not only can the thin-film deposition system 100 adjusts the gap 110, but the thin-film deposition system 100 can adjust the gap in real time during thin-film deposition processes responsive to changing conditions during the thin-film deposition processes.

Figure 3:
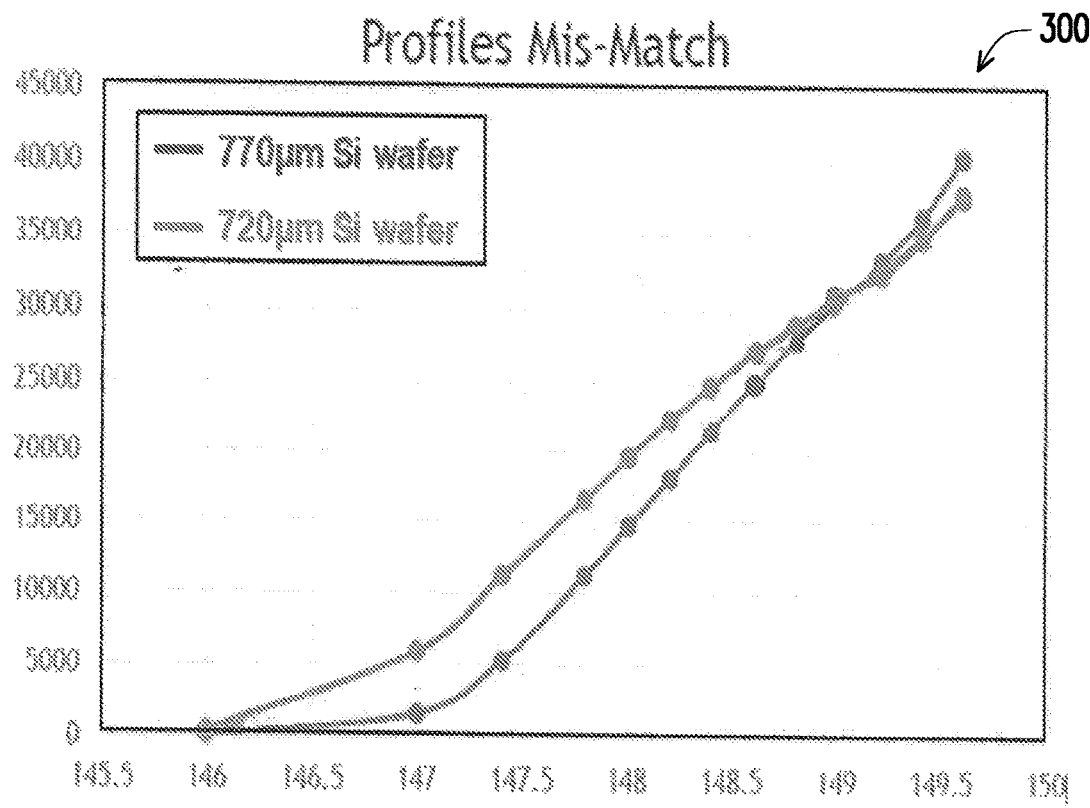
FIG. 3 includes graphs of thin-film deposition rates, according to one embodiment.
Figure 3:
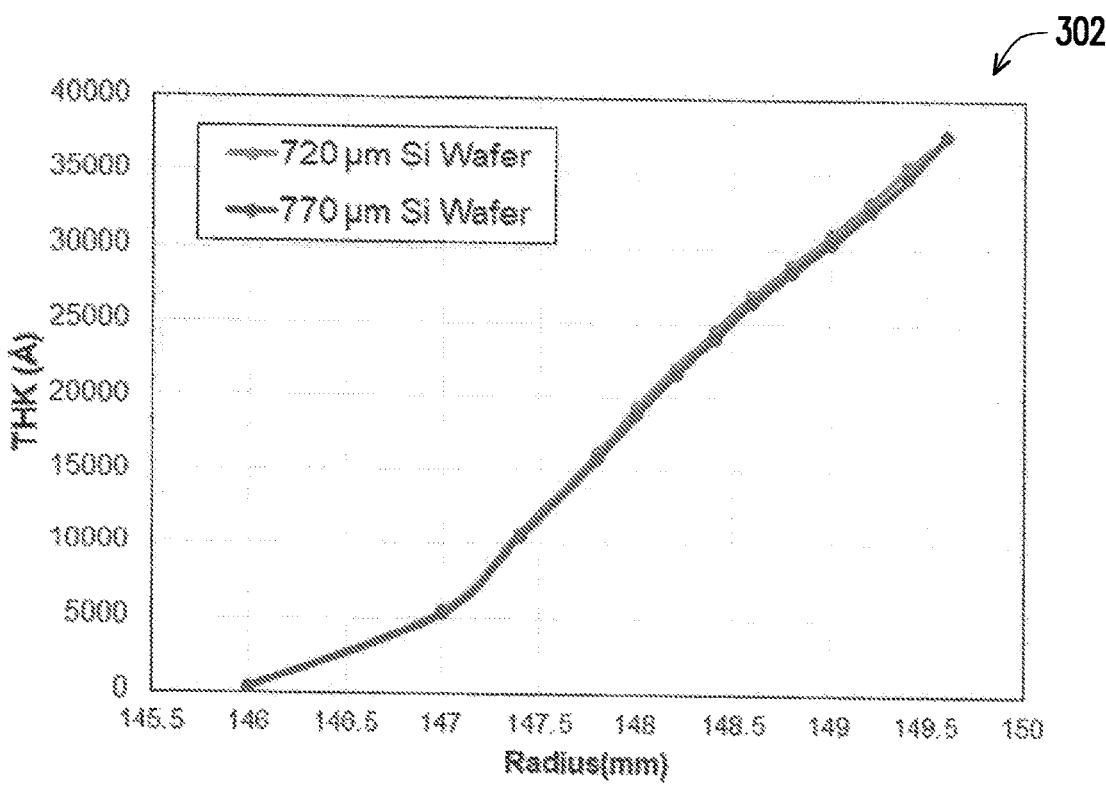

FIG. 3 includes graphs 300 and 302 indicating thin-film deposition rates for two types of wafers, according to one embodiment. The graph 300 illustrates that the deposition rate is different for wafers of thickness 720 µm than for wafers of thickness 770 µm in the absence of in situ gap adjustment as described in relation to FIGS. 1 and 2. For wafers of various radius, the 770 µm wafers have different deposition rates than the 720 µm thick wafers. This is because the gap 110 is different for these wafers based on their different thicknesses.

The graph 302 illustrates a situation in which in situ gap control is performed as described in relation to FIGS. 1 and 2. In this case, the wafers of thickness 770 µm have the same deposition rate as the wafers of thickness 720 µm. This is because the gap sensor 112 and the control system 114 cooperate to measure and adjust the gap 110 as described in relation to FIGS. 1 and 2. Thus, the two types of wafers have the same gap 110 in the same deposition rate.

Figure 4A:
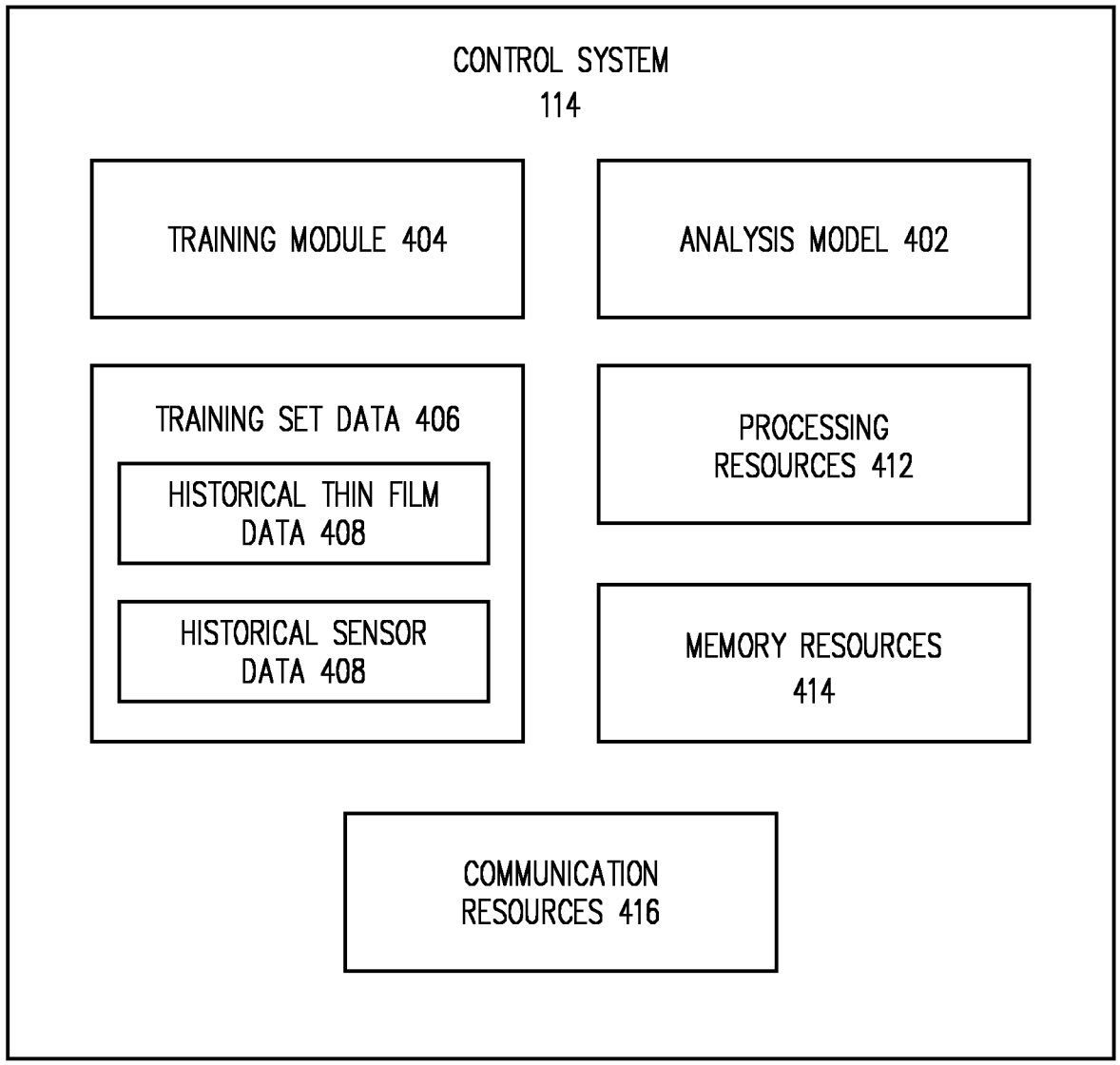
FIG. 4A is a block diagram of a control system, according to one embodiment.

FIG. 4A is a block diagram of the control system 114 of FIGS. 1 and 2, according to one embodiment. The control system 114 of FIG. 4A is configured to control operation of the thin-film deposition system 100 in depositing a thin-film on the wafer 104 and adjusting the gap 110, according to one embodiment. The control system 114 utilizes machine learning to learn to properly adjust the gap 110 responsive to the sensor signals received from the gap sensor 112. The control system 114 can adjust the gap 110 in-situ during a thin-film deposition process.

In one embodiment, the control system 114 includes an analysis model 402 and a training module 404. The training module trains the analysis model 402 with a machine learning process. The machine learning process trains the analysis model 402 to adjust the gap 110 to result in a thin-film having selected characteristics. Although the training module 404 is show$_n$ as being separate from the analysis model 402, in practice, the training module 404 may be part of the analysis model 402.

The control system 114 includes, or stores, training set data 406. The training set data 406 includes historical thin-film data 408 and historical sensor data 410. The historical thin-film data 408 includes data related to thin-films resulting from thin-film deposition processes. The historical sensor data 410 includes data related to sensor signals during the thin-film deposition processes that generated the thin-films. As will be set forth in more detail below, the training module 404 utilizes the historical thin-film data 408 and the historical sensor data 410 to train the analysis model 402 with a machine learning process.

In one embodiment, the historical thin-film data 408 includes data related to the thickness and composition of historically deposited thin-films. For example, during operation of a semiconductor fabrication facility, thousands or millions of semiconductor wafers may be processed over the course of several months or years. Each of the semiconductor wafers may include thin-films deposited by thin-film deposition processes. After each thin-film deposition process, the thicknesses of the thin-films are measured as part of a quality control process. The historical thin-film data 408 includes the thicknesses of each of the thin-films deposited by thin-film deposition processes. Accordingly, the historical thin-film data 408 can include thickness data for a large number of thin-films deposited by thin-film deposition processes.

In one embodiment, the historical sensor data 410 include various sensor signals or sensor data generated by gap sensors during thin-film deposition processes that deposited the thin-films associated with the historical thin-film data 408. Accordingly, for each thin-film having data in the historical thin-film data 408, the historical sensor data 410 can include the sensor signals that were generated by the gap sensor 112 during deposition of the thin-film. For example, the historical sensor data 410 can the voltages generated by the radiation sensor 123.

In one embodiment, the training set data 406 links the historical thin-film data 408 with the historical sensor data 410. In other words, the thin-film thickness, material composition, or crystal structure associated with a thin-film in the historical thin-film data 408 is linked to the sensor signals data associated with that deposition process. As will be set forth in more detail below, the labeled training set data can be utilized in a machine learning process to train the analysis model 402 to predict semiconductor sensor signals that will result in properly formed thin-films.

In one embodiment, the control system 114 includes processing resources 412, memory resources 414, and communication resources 416. The processing resources 412 can include one or more controllers or processors. The processing resources 412 are configured to execute software instructions, process data, make thin-film deposition control decisions, perform signal processing, read data from memory, write data to memory, and to perform other processing operations. The processing resources 412 can include physical processing resources 412 located at a site or facility of the thin-film deposition system 100. The processing resources can include virtual processing resources 412 remote from the site thin-film deposition system 100 or a facility at which the thin-film deposition system 100 is located. The processing resources 412 can include cloud-based processing resources including processors and servers accessed via one or more cloud computing platforms.

In one embodiment, the memory resources 414 can include one or more computer readable memories. The memory resources 414 are configured to store software instructions associated with the function of the control system and its components, including, but not limited to, the analysis model 402. The memory resources 414 can store data associated with the function of the control system 114 and its components. The data can include the training set data 406, current sensor signals data, and any other data associated with the operation of the control system 114 or any of its components. The memory resources 414 can include physical memory resources located at the site or facility of the thin-film deposition system 100. The memory resources can include virtual memory resources located remotely from site or facility of the thin-film deposition system 100. The memory resources 414 can include cloud-based memory resources accessed via one or more cloud computing platforms.

In one embodiment, the communication resources can include resources that enable the control system 114 to communicate with equipment associated with the thin-film deposition system 100. For example, the communication resources 416 can include wired and wireless communication resources that enable the control system 114 to receive the sensor signals and to control the radiofrequency power source 122, the gas source 124, the heater 116, and the motor that raises and lowers the top plate 108.

Figure 4B:
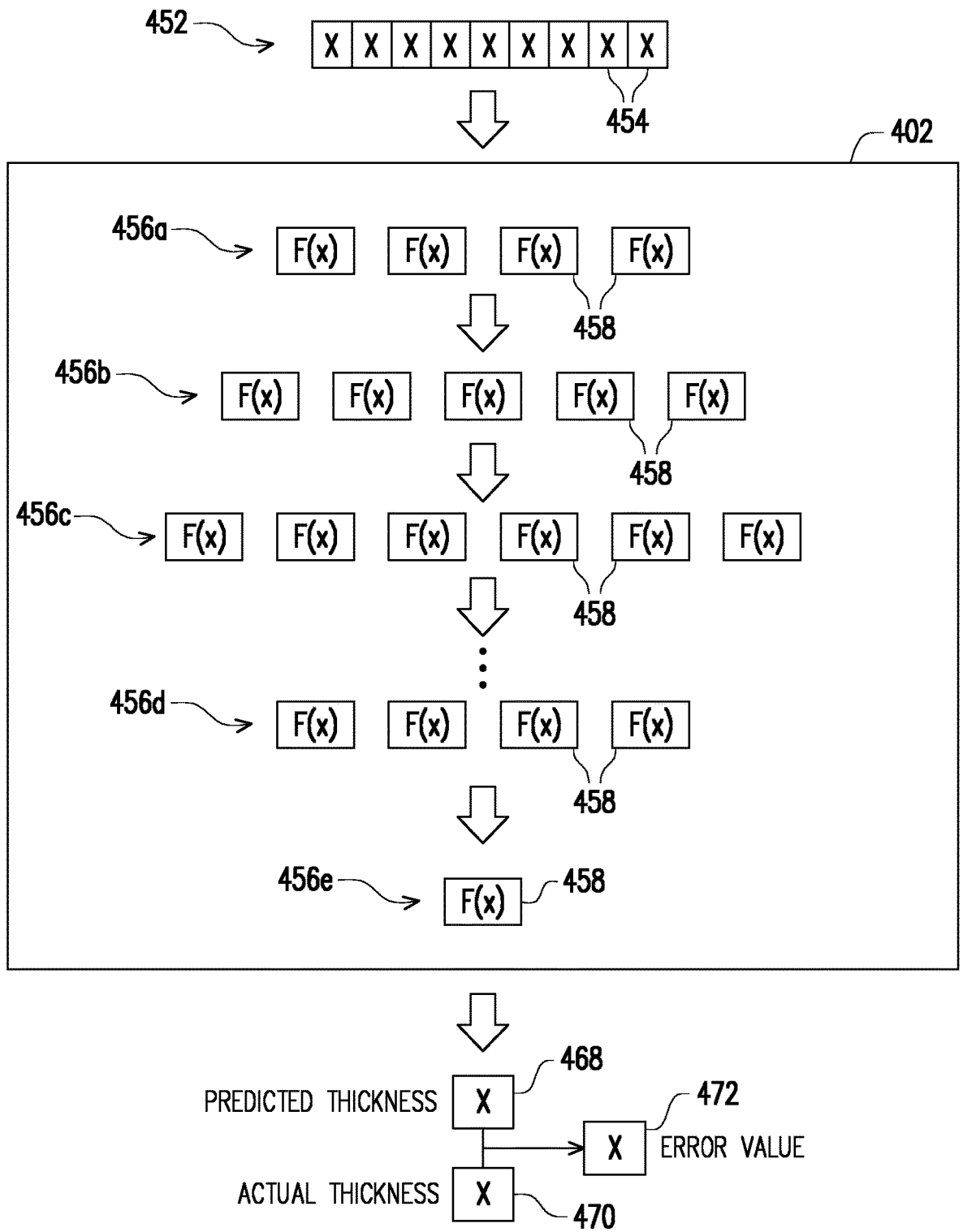
FIG. 4B is a block diagram of an analysis model of the control system of FIG. 4A, according to one embodiment.

FIG. 4B is a block diagram illustrating operational aspects and training aspects of the analysis model 402 of FIG. 4A, according to one embodiment. The analysis model 402 can be used to select adjustments to the gap 110 between the wafer 104 and the top plate 108 as described in relation to FIGS. 1 and 2. As described previously, the training set data 406 includes data related to a plurality of previously performed thin-film deposition processes. Each previously performed thin-film deposition process deposited a thin-film having a particular thickness and being associated with particular sensor signals based on the gap 110. The sensor signals for each previously performed thin-film deposition process are formatted into a respective sensor signals vector 452. The sensor signals vector includes a plurality of data fields 454. Each data field 454 corresponds to a sensor signal at a particular time during the deposition process.

The analysis model 402 includes a plurality of neural layers 456a-e. Each neural layer includes a plurality of nodes 458. Each node 458 can also be called a neuron. Each node 458 from the first neural layer 456a receives the data values for each data field from the sensor signals vector 452. Accordingly, in the example of FIG. 4B, each node 458 from the first neural layer 456a receives nine data values because the sensor signals vector 452 has nine data fields. Each neuron 458 includes a respective internal mathematical function labeled F(x) in FIG. 4B. Each node 458 of the first neural layer 456a generates a scalar value by applying the internal mathematical function F(x) to the data values from the data fields 454 of the sensor signals vector 452. Further details regarding the internal mathematical functions F(x) are provided below.

Each node 458 of the second neural layer 456b receives the scalar values generated by each node 458 of the first neural layer 456a. Accordingly, in the example of FIG. 4B each node of the second neural layer 456b receives four scalar values because there are four nodes 458 in the first neural layer 456a. Each node 458 of the second neural layer 456b generates a scalar value by applying the respective internal mathematical function F(x) to the scalar values from the first neural layer 456a.

Each node 458 of the third neural layer 456c receives the scalar values generated by each node 458 of the second neural layer 456b. Accordingly, in the example of FIG. 4B each node of the third neural layer 456c receives five scalar values because there are five nodes 458 in the second neural layer 456b. Each node 458 of the third neural layer 456c generates a scalar value by applying the respective internal mathematical function F(x) to the scalar values from the nodes 458 of the second neural layer 456b.

Each node 458 of the neural layer 456d receives the scalar values generated by each node 458 of the previous neural layer (not shown). Each node 458 of the neural layer 456d generates a scalar value by applying the respective internal mathematical function F(x) to the scalar values from the nodes 458 of the second neural layer 456b.

The final neural layer includes only a single node 458, for example. The final neural layer receives the scalar values generated by each node 458 of the previous neural layer 456d. The node 458 of the final neural layer 456e generates a data value 468 by applying a mathematical function F(x) to the scalar values received from the nodes 458 of the neural layer 456d.

In the example of FIG. 4B, the data value 468 corresponds to the predicted thickness of a thin-film generated by sensor signals data corresponding to values included in the sensor signals vector 452. In other embodiments, the final neural layer 456e may generate multiple data values each corresponding to a particular thin-film characteristic such as thin-film crystal orientation, thin-film uniformity, or other characteristics of a thin-film. The final neural layer 456e will include a respective node 458 for each output data value to be generated. In the case of a predicted thin-film thickness, engineers or user can provide constraints to specify that the predicted thin-film thickness 468 falls within a selected range, such as between 0 nm and 50 nm, in one example. The analysis model 402 will adjust internal functions F(x) to ensure that the data value 468 corresponding to the predicted thin-film thickness will fall within the specified range.

During the machine learning process, the analysis model compares the predicted thickness in the data value 468 to the actual thickness of the thin-film as indicated by the data value 470. As set forth previously, the training set data 406 includes, for each set of historical sensor signals data, thin-film characteristics data indicating the characteristics of the thin-film that resulted from the historical thin-film deposition process. Accordingly, the data field 470 includes the actual thickness of the thin-film that resulted from the deposition process reflected in the sensor signals vector 452. The analysis model 402 compares the predicted thickness from the data value 468 to the actual thickness from the data value 470. The analysis model 402 generates an error value 472 indicating the error or difference between the predicted thickness from the data value 468 and the actual thickness from the data value 470. The error value 472 is utilized to train the analysis model 402.

The training of the analysis model 402 can be more fully understood by discussing the internal mathematical functions F(x). While all of the nodes 458 are labeled with an internal mathematical function F(x) in one embodiment, the mathematical function F(x) of each node is unique. In one example, each internal mathematical function has the following form:

$$F(x)=x_1*w_1+x_2*w_2+\ldots x_n*w_1+b.$$

In the equation above, each value $x_1$-$x_n$ corresponds to a data value received from a node 458 in the previous neural layer, or, in the case of the first neural layer 456a, each value $x_1$-$x_n$ corresponds to a respective data value from the data fields 454 of the sensor signals vector 452. Accordingly, n for a given node is equal to the number of nodes in the previous neural layer. The values $w_1$-$w_n$ are scalar weighting values associated with a corresponding node from the previous layer. The analysis model 402 selects the values of the weighting values $w_1$-$w_n$. The constant b is a scalar biasing value and may also be multiplied by a weighting value. The value generated by a node 458 is based on the weighting values $w_1$-$w_n$. Accordingly, each node 458 has n weighting values $w_1$-$w_n$. Though not show$_n$ above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 472 has been calculated, the analysis model 402 adjusts the weighting values $w_1$-$w_n$ for the various nodes 458 of the various neural layers 456a-356e. After the analysis model 402 adjusts the weighting values $w_1$-$w_n$, the analysis model 402 again provides the sensor signals vector 452 to the input neural layer 456a. Because the weighting values are different for the various nodes 458 of the analysis model 402, the predicted thickness 468 will be different than in the previous iteration. The analysis model 402 again generates an error value 472 by comparing the actual thickness 470 to the predicted thickness 468.

The analysis model 402 again adjusts the weighting values $w_1$-$w_n$ associated with the various nodes 458. The analysis model 402 again processes the sensor signals vector 452 and generates a predicted thickness 468 and associated error value 472. The training process includes adjusting the weighting values $w_1$-$w_n$ in iterations until the error value 472 is minimized.

FIG. 4B illustrates a single sensor signals vector 452 being passed to the analysis model 402. In practice, the training process includes passing a large number of sensor signals vectors 452 through the analysis model 402, generating a predicted thickness 468 for each sensor signals vector 452, and generating associated error value 472 for each predicted thickness. The training process can also include generating an aggregated error value indicating the average error for all the predicted thicknesses for a batch of sensor signals vectors 452. The analysis model 402 adjusts the weighting values $w_1$-$w_n$ after processing each batch of sensor signals vectors 452. The training process continues until the average error across all sensor signals vectors 452 is less than a selected threshold tolerance in one embodiment. When the average error is less than the selected threshold tolerance, the analysis model 402 training is complete and the analysis model is trained to accurately predict the thickness of thin-films based on the sensor signals. The analysis model 402 can then be used to select sensor signal values that will result in a desired thin-film thickness. Thus, the analysis model can receive current sensor signals, determine sensor signal values that will result in the desired thin-film thickness, and then adjust the gap 110 to adjust the sensor signals.

A particular example of a neural network based analysis model 402 has been described in relation to FIG. 4B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 5:
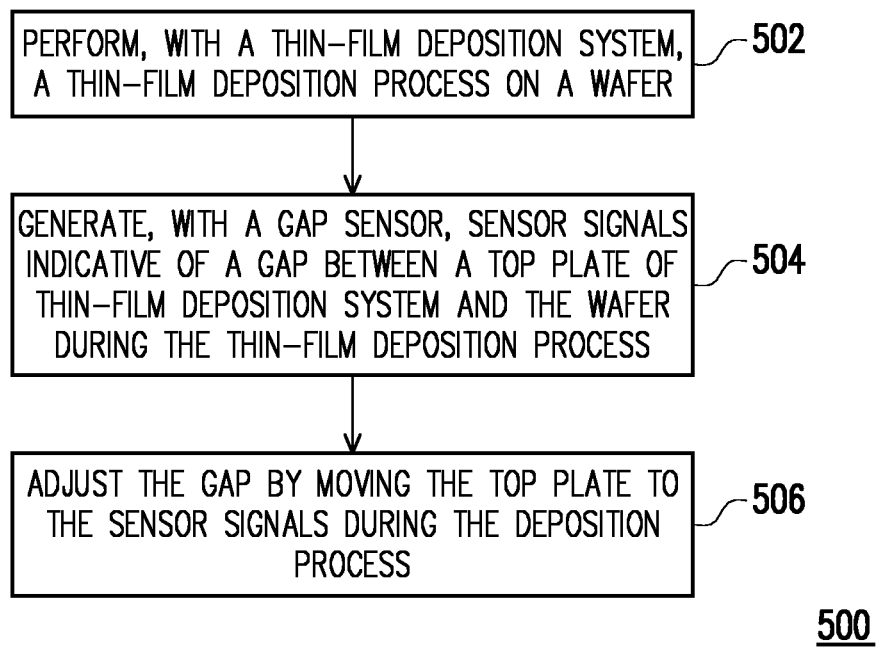
FIG. 5 is a flow diagram of a method for performing a thin-film deposition process, according to one embodiment.

FIG. 5 is a flow diagram of a method 500 for performing a thin-film deposition process. The method 500 can be performed in relation to the systems, components, and processes described in relation to FIGS. 1-4B. At 502 the method 500 includes performing, with a thin-film deposition system, a thin-film deposition process on a wafer. One example of a thin-film deposition system is the thin-film deposition system 100 of FIG. 1. At 504, the method 500 includes generating, with a gap sensor, sensor signals indicative of a gap between a top plate of thin-film deposition system and the wafer during the thin-film deposition process. One example of a gap sensor is the gap sensor 112 of FIG. 1. One example of a top plate is the top plate 108 of FIG. 1. One example of a wafer, is the wafer 104 of FIG. 1. One example of a gap, is the gap 110 of FIG. 1. At 506, the method 500 includes adjusting the gap by moving the top plate responsive to the sensor signals during the thin-film deposition process.

Figure 6:
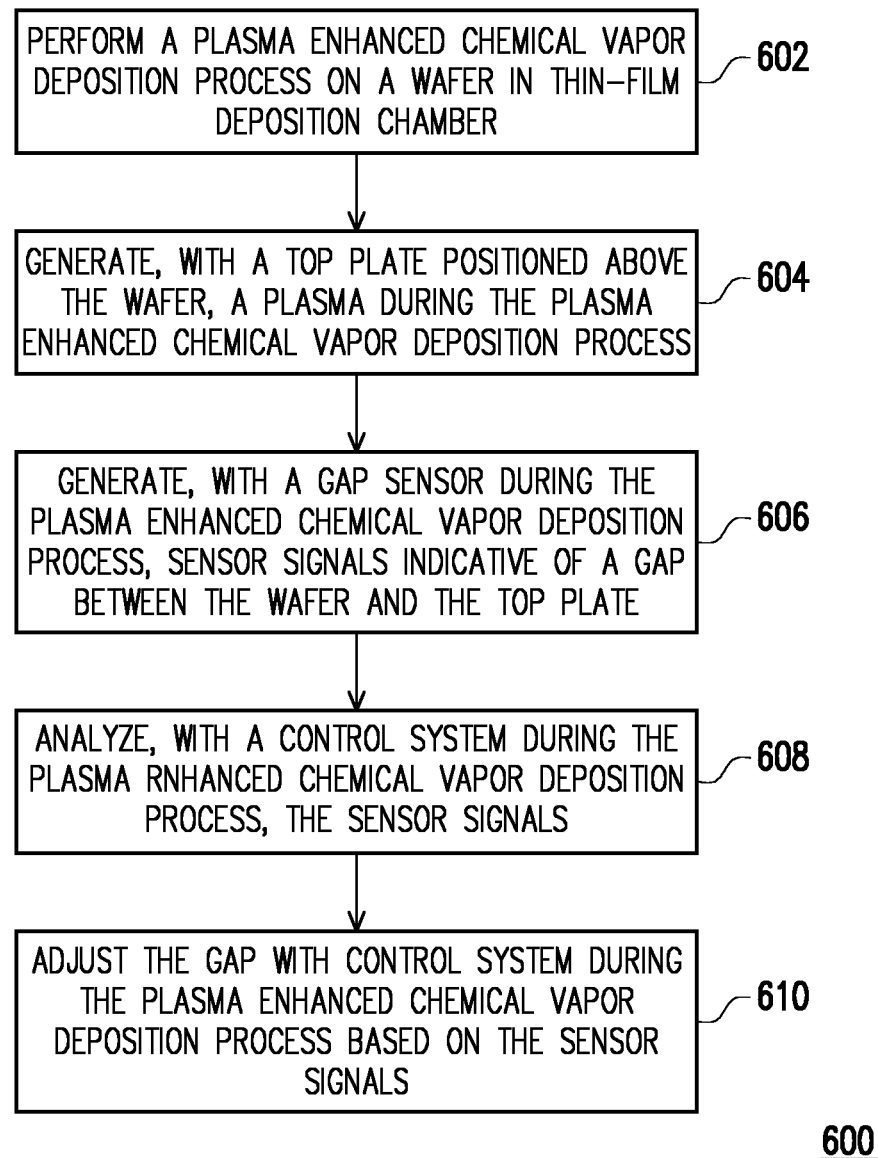
FIG. 6 is a flow diagram of a method for performing a thin-film deposition process, according to one embodiment.

FIG. 6 is a flow diagram of a method 600 for performing a thin-film deposition process. The method 600 can be performed in relation to the systems, components, and processes described in relation to FIGS. 1-5. At 602 the method 600 includes performing a plasma enhanced chemical vapor deposition process on a wafer in thin-film deposition chamber. One example of a thin-film deposition chamber is the thin-film deposition chamber 100 of FIG. 2. One example of a wafer is the wafer 104 of FIG. 2. At 604, the method 600 includes generating, with a top plate positioned above the wafer, a plasma during the plasma enhanced chemical vapor deposition process. One example of a top plate is the top plate 108 of FIG. 2. At 606, the method 600 includes generating, with a gap sensor during the plasma enhanced chemical vapor deposition process, sensor signals indicative of a gap between the wafer and the top plate. One example of a gap sensor is the gap sensor 112 of FIG. 2. One example of a gap is the gap 110 of FIG. 2. At 608, the method 600 includes analyzing, with a control system during the plasma enhanced chemical vapor deposition process, the sensor signals. One example of a control system is the control system 114 of FIG. 2. At 610, the method 600 includes adjusting the gap with the control system during the plasma enhanced chemical vapor deposition process based on the sensor signals.

In one embodiment, a method includes performing, with a thin-film deposition system, a thin-film deposition process on a wafer, generating, with a gap sensor, sensor signals indicative of a gap between a top plate of thin-film deposition system and the wafer during the thin-film deposition process, and adjusting the gap by moving the top plate responsive to the sensor signals during the thin-film deposition process.

In one embodiment, a thin-film deposition system includes a thin-film deposition chamber, a wafer support positioned in the thin-film deposition chamber and configured to support a wafer in the thin-film deposition chamber, and a top plate positioned above the wafer support and configured to generate a plasma in the thin-film deposition chamber during a thin-film deposition process. The system includes a gap sensor configured to generate sensor signals indicative of a gap between the top plate and the wafer during a thin-film deposition process and a control system configured to receive the sensor signals and to adjust the gap responsive to the sensor signals.

In one embodiment, a method includes performing a plasma enhanced chemical vapor deposition process on a wafer in thin-film deposition chamber, generating, with a top plate positioned above the wafer, a plasma during the plasma enhanced chemical vapor deposition process, and generating, with a gap sensor during the plasma enhanced chemical vapor deposition process, sensor signals indicative of a gap between the wafer and the top plate. The method includes analyzing, with a control system during the plasma enhanced chemical vapor deposition process, the sensor signals and adjusting the gap with the control system during the plasma enhanced chemical vapor deposition process based on the sensor signals.

Embodiments of the present disclosure provide a thin-film deposition system with improved performance. A thin-film deposition system includes a top plate positioned above a wafer. Embodiments of the present disclosure monitor the gap between the top plate and the wafer and automatically adjust the gap in-situ during a deposition process. This helps prevent arcing between the top plate and the wafer due to smaller than desired gaps. This also provides for steady deposition rates. The result is that fewer wafers are scrapped, equipment is replaced less frequently, and thin-films are properly formed.

The various embodiments described above can be combined to provide further embodiments. Aspects of the embodiments can be modified, as needed, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
performing, with a thin-film deposition system, a thin-film deposition process on a wafer;
generating, with a gap sensor, sensor signals indicative of a gap between a top plate of the thin-film deposition system and the wafer during the thin-film deposition process, wherein the gap sensor is a thru-beam sensor, wherein generating sensor signals includes outputting a radiation beam through the gap with a radiation emitter of the thru-beam sensor and receiving the radiation beam with a radiation sensor of the thru-beam sensor, wherein the radiation beam has a diameter that is greater than the gap; and
adjusting the gap by moving the top plate responsive to the sensor signals during the thin-film deposition process.

2. The method of claim 1, wherein the radiation beam is a laser beam.

3. The method of claim 2, wherein the laser beam is an infrared laser beam.

4. The method of claim 1, further comprising generating a voltage with the radiation sensor, wherein the voltage is indicative of the gap.

5. The method of claim 1, further comprising passing the sensor signals to a control system.

6. The method of claim 5, further comprising:
determining, with the control system, an adjustment to be made to the gap based on the sensor signals; and
adjusting the gap by moving the top plate in accordance with the determined adjustment.

7. The method of claim 1, further comprising generating a plasma with the top plate during the thin-film deposition process.

8. The method of claim 1, further comprising adjusting the gap responsive to thermal expansion of the top plate.

9. A method, comprising:
supporting a wafer with a wafer support positioned in a thin-film deposition chamber;
generating, with a top plate positioned above the wafer support, a plasma in the thin-film deposition chamber during a thin-film deposition process;
generating, with a thru-beam sensor, sensor signals indicative of a gap between the top plate and the wafer by outputting a radiation beam through the gap with a radiation emitter of the thru-beam sensor and receiving the radiation beam with a radiation sensor of the thru-beam sensor, wherein the radiation beam has a diameter that is greater than the gap;

determining a size of the gap based on the sensor signals; and
adjusting the gap with a control system based on the size of the gap.

10. The method of claim 9, comprising adjusting the gap during the thin-film deposition process.

11. The method of claim 9, wherein the thru-beam sensor is positioned within the thin-film deposition chamber.

12. The method of claim 9, wherein the cameras are thru-beam sensor is positioned external to the thin-film deposition chamber.

13. The method of claim 9, comprising:
heating the wafer with a heater of the wafer support during the thin-film deposition process; and
generating the plasma with a bottom plate of the wafer support in cooperation the top plate.

14. A method, comprising:
performing a plasma enhanced chemical vapor deposition process on a wafer in thin-film deposition chamber;
generating, with a top plate positioned above the wafer and a bottom plate positioned below the wafer, a plasma during the plasma enhanced chemical vapor deposition process;
generating, with a gap sensor during the plasma enhanced chemical vapor deposition process, sensor signals indicative of a gap between the wafer and the top plate, wherein the gap sensor is a thru-beam sensor, wherein generating sensor signals includes outputting a radiation beam through the gap with a radiation emitter of the thru-beam sensor and receiving the radiation beam with a radiation sensor of the thru-beam sensor, wherein the radiation beam has a diameter that is greater than the gap; and
adjusting the gap with a control system during the plasma enhanced chemical vapor deposition process based on the sensor signals.

15. The method of claim 14, wherein the deposition process includes flowing a fluid into the deposition chamber via a showerhead a electrode corresponding to the top plate.

16. The method of claim 14, wherein performing the chemical vapor deposition process includes flowing a fluid into the deposition chamber via a apertures above the top plate.

17. The method of claim 14, comprising heating the wafer with a heater of the wafer support during the thin-film deposition process.

18. The method of claim 14, wherein the bottom plate is embedded in a wafer support.

19. The method of claim 9, wherein the deposition process includes flowing a fluid into the deposition chamber via a showerhead a electrode corresponding to the top plate.

20. The method of claim 9, wherein performing the chemical vapor deposition process includes flowing a fluid into the deposition chamber via a apertures above the top plate.

* * * * *